United States Patent [19]

Kano et al.

[11] 4,141,024
[45] Feb. 20, 1979

[54] SOLID STATE IMAGE SENSING DEVICE

[75] Inventors: Yasuo Kano, Tokyo; Hiroshi Yamazaki; Tetsuo Ando, both of Ebina, all of Japan

[73] Assignee: Sony Corporation, Tokyo, Japan

[21] Appl. No.: 902,071

[22] Filed: May 2, 1978

Related U.S. Application Data

[63] Continuation of Ser. No. 725,999, Sep. 23, 1976, abandoned.

[30] Foreign Application Priority Data

Sep. 25, 1975 [JP] Japan ................................ 50-115778

[51] Int. Cl.² .................... H01L 29/78; H01L 29/04; H01L 27/14; H01L 31/00
[52] U.S. Cl. ........................................ 357/24; 357/30; 357/59; 250/211 J; 307/221 D
[58] Field of Search ............... 357/24, 30; 307/221 D; 250/211 J

[56] References Cited

U.S. PATENT DOCUMENTS

| | | | |
|---|---|---|---|
| 3,813,541 | 5/1974 | Foss et al. | 357/30 |
| 3,932,775 | 1/1976 | Kosonocky | 357/24 |
| 4,012,587 | 3/1977 | Ochi et al. | 357/24 |
| 4,081,841 | 3/1978 | Ochi et al. | 250/211 J |

OTHER PUBLICATIONS

Carnes "Charge-Coupled Imaging: State of the Art", 3rd European Solid State Device Res. Conf., Munich (9/73), Papers, pp. 83-107.

*Primary Examiner*—William D. Larkins
*Assistant Examiner*—Gene M. Munson
*Attorney, Agent, or Firm*—Hill, Gross, Simpson, Van Santen, Steadman, Chiara & Simpson

[57] ABSTRACT

A solid state image sensing device having a semiconductor substrate, an insulating layer disposed on one major surface of the substrate, plural channel stopper regions formed in the substrate in faced relation to the major surface of the substrate, each channel stopper region being extended in the column direction with a distance between adjacent ones and plural sets of electrodes disposed over the insulating layer, each set including a pair of electrode members, each electrode member being extended in the row direction, in which a window portion is formed in the pair of electrode members at one side of the distance between adjacent channel stopper regions and the width of the window portion in the column direction is selected more than a predetermined value.

7 Claims, 20 Drawing Figures

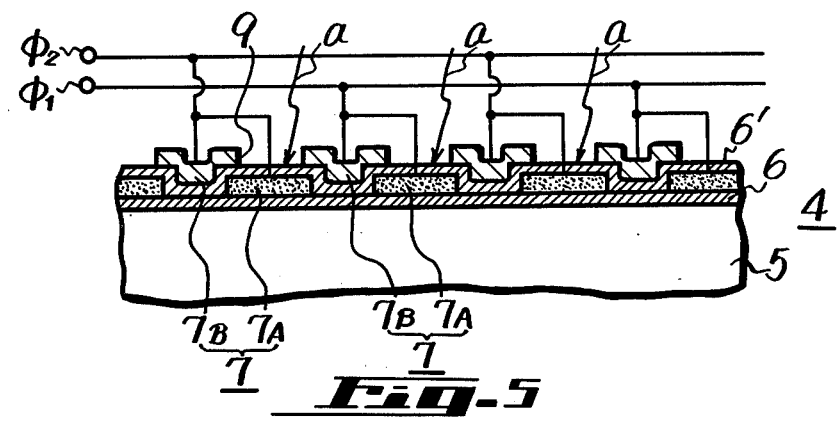
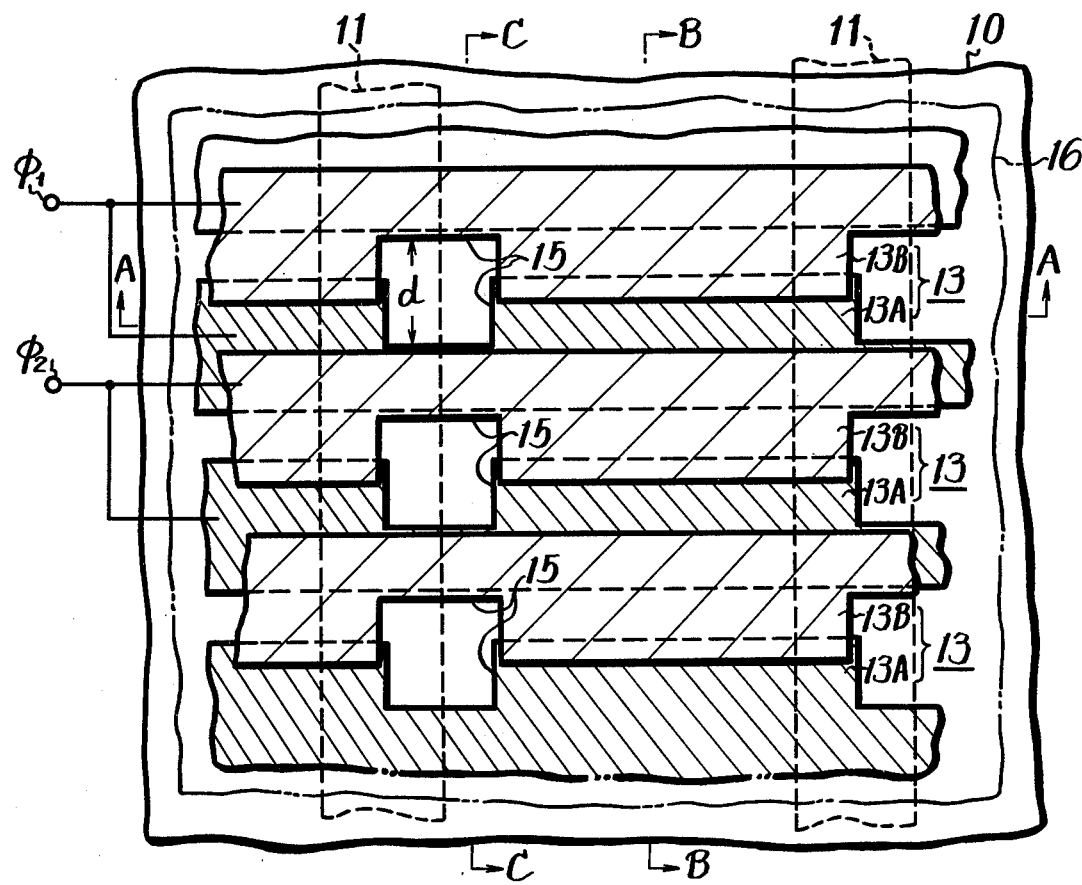

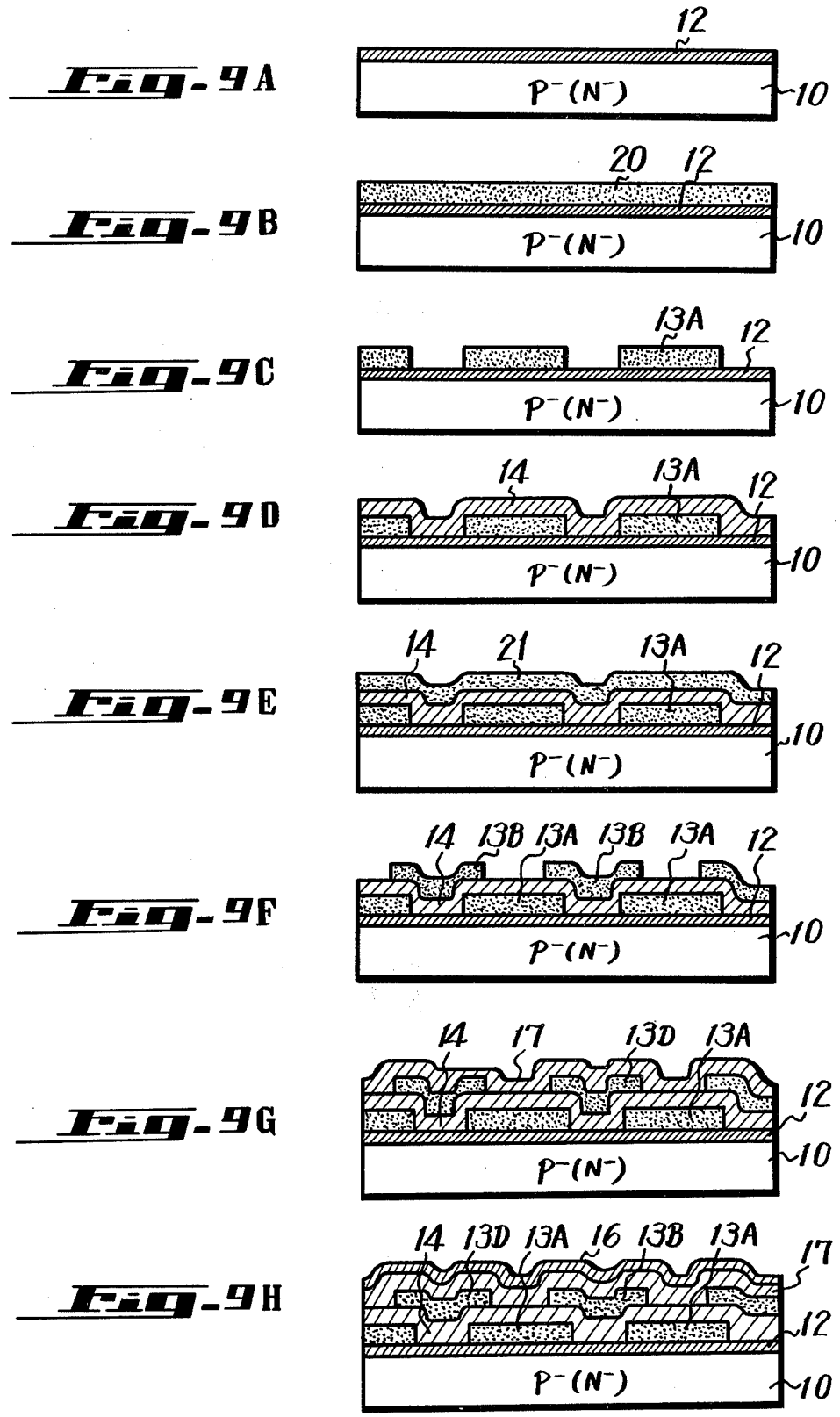

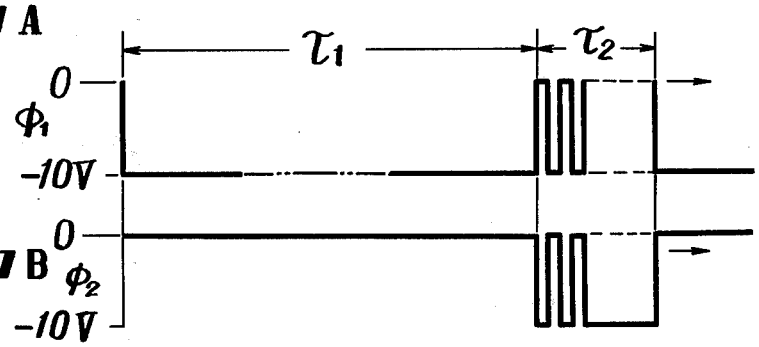
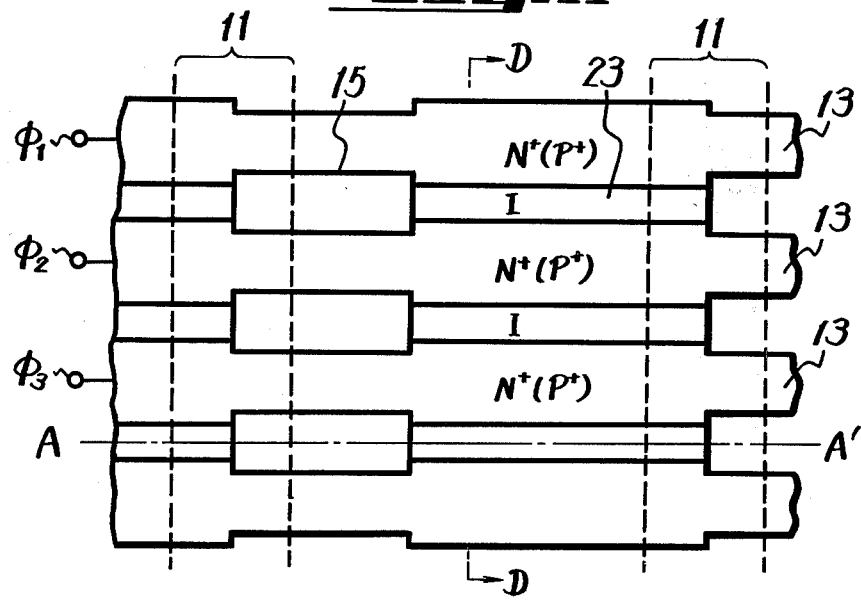
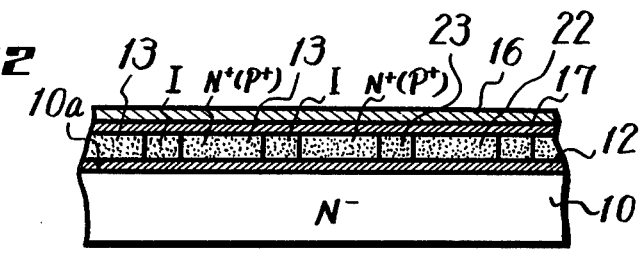

SOLID STATE IMAGE SENSING DEVICE

This is a continuation of application Ser. No. 725,999, filed Sept. 23, 1976, now abandoned.

BACKGROUND OF THE INVENTION

1. Field of the Invention:

The present invention relates generally to a solid state image sensing device, and is directed more particularly to a solid state image sensor device of a frame transfer system which employs a charge transfer device (which will be referred hereinafter to as a CTD).

2. Description of the Prior Art:

A prior art solid state image sensing device of the frame transfer system will be described with reference to FIG. 1. This prior art image sensor device consists of an image sensing array 1 which will produce an electric charge or carrier pattern corresponding to picked-up pattern or amount of received light, a temporary storage array 2 which temporarily stores the charge pattern from the image sensing array 1, and a shift register 3 which sequentially transfers the signals from the storage array 2 to an output terminal t. The image sensing array 1 is formed of a plurality of CTDs 4 aligned in the vertical direction, the temporary storage array 2 is formed of a plurality of CCDs 4 aligned in correspondence with the arrays 4 of the image sensing array 1, and the shift register 3 is formed also of the CCD 4. In order to produce an electric charge or carrier pattern corresponding to a light image to be received on the image sensing array 1, image sensing cells are formed in the image sensing array 1.

An example of the image sensing array 1 will be now described with reference to FIGS. 2 and 3. A semiconductor substrate, for example, a silicon substrate 5, which is of low impurity concentration, has provided on its one major surface an insulating layer 6 made of silicon dioxide $SiO_2$ or the like. On the insulating layer 6 there are formed strip electrodes 7 which are arranged common to the respective CTDs 4, and extended in the horizontal direction with a gap G between adjacent ones. Every third electrode 7 is connected together and the electrodes 7 connected together are supplied with 3-phase clock pulses $\phi_1$, $\phi_2$ and $\phi_3$, respectively. Between adjacent CTDs 4 there is formed a strip channel stopper region 8 of high impurity concentration which faces the major surface of the semiconductor substrate 5.

An image sensing cell 9 is formed in the gap G between the adjacent electrodes 7 and between the adjacent channel stoppers 8. Electric charges or carriers produced on the image sensing cells 9 in response to the amount of received lights are transferred successively in, for example, the column direction by the clock pulses $\phi_1$, $\phi_2$ and $\phi_3$, and then transferred to the temporary storage array 2.

With the prior art solid state image sensing device constructed as above, since the image sensing cell 9 is formed between the adjacent transfer electrodes 7, it is desired so as to increase its light receiving efficiency that the width of the gap G is selected large. However, if this width of the gap G is made large, a disadvantage results from the fact that the carrier transfer efficiency is lowered; that is, the light receiving efficiency is contradictory to the carrier transfer efficiency.

FIG. 4 shows another example of the CTD 4 which forms the image sensing cell 9. In the example of FIG. 4, an impurity is selectively doped at high concentration to the insulating layer 6 formed on the semiconductor substrate 5 to form first strip transfer electrodes 7A, which are made of a polycrystalline silicon layer of low resistivity and which are arranged with a predetermined gap between adjacent ones. Then, a second insulating layer 6' made of $SiO_2$ is coated so as to cover all of the strip electrodes 7A and the insulating layer 6 between the adjacent electrodes 7A, and a second strip transfer electrode 7B made of, for example, aluminum is formed on the portion between the first electrodes 7A on which the insulating layers 6 and 6' are formed. The first and second electrodes 7A and 7B are electrically connected at their one ends to form the transfer electrode 7. The every second transfer electrode 7 is connected commonly to provide two sets of electrodes. The two sets of electrodes 7 are supplied with the clock pulses $\phi_1$ and $\phi_2$ to transfer the carriers. Such a type of CTD is called a 2-phase CTD In such a type of CTD, the image sensing cell 9 is formed between the adjacent second electrodes 7B of the transfer electrodes 7 and receives light along arrows a in FIG. 4.

In the case that the above construction of CTD is used, there is produced no gap between the electrodes 7 on the surface of the substrate 5 in the carrier transfer direction, so that the carrier transfer efficiency can be improved relatively. However, since polycrystalline silicon layer or first electrode 7A exists in the image sensing cell 9, the light reception is carried out through the polycrystalline silicon layer 7A. As a result, there occurs such a disadvantage that its sensitivity for the light, especially the light of short wave is lowered.

OBJECTS AND SUMMARY OF THE INVENTION

Accordingly, it is a main object of this invention to provide a novel solid state image sensor device.

It is another object of the invention to provide a solid state image sensor device, which is of a frame transfer system employing a CTD, free from the defects encountered in the prior art.

It is a further object of the invention to provide a solid state image sensor device of the frame transfer system which has a special construction of image sensing cells.

According to an aspect of the invention, there is provided a solid state image sensor device which comprises a semiconductor substrate of one conductivity type, an insulating layer formed on a first surface of said substrate, a plurality of channel stopper regions of said one conductivity type formed in said substrate in faced relation to its first surface, said channel stopper regions being extended in the column direction with a distance between adjacent ones, a plurality of sets of electrodes formed on said insulating layer, each set of electrodes including a pair of electrode members, each of said electrode members being extended in the row direction, and a plurality of window portions formed in said pair of electrode members at one side of the distance between adjacent channel stopper regions.

The other objects, features and advantages of the invention will become apparent from the following description taken in conjunction with the accompanying drawings.

BRIEF DESCRIPTION OF THE DRAWINGS

FIG. 4 is a cross-sectional view of another prior art image sensing array;

FIG. 5 is a fragmentary top plan view showing in enlarged scale the main part of an image sensing array of a solid state image sensor device according to the invention;

FIGS. 9A to 9H, inclusive, are cross-sectional views used for explaining the process for making the solid state image sensor device of the invention;

FIGS. 10A and 10B are voltage waveform diagrams used for the explanation of the operation of the invention;

FIG. 11 is a fragmentary top plan view showing another example of the invention; and FIG. 12 is a cross-sectional view taken on the line D—D in FIG. 11.

DESCRIPTION OF THE PREFERRED EMBODIMENTS

Figure 1:
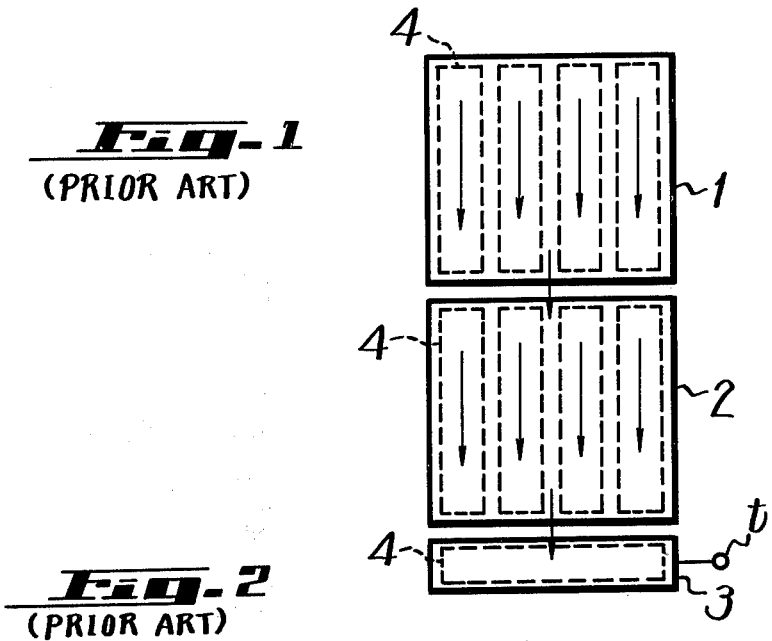
FIG. 1 is a schematic diagram showing a prior art solid state image sensor device.
Figure 2:
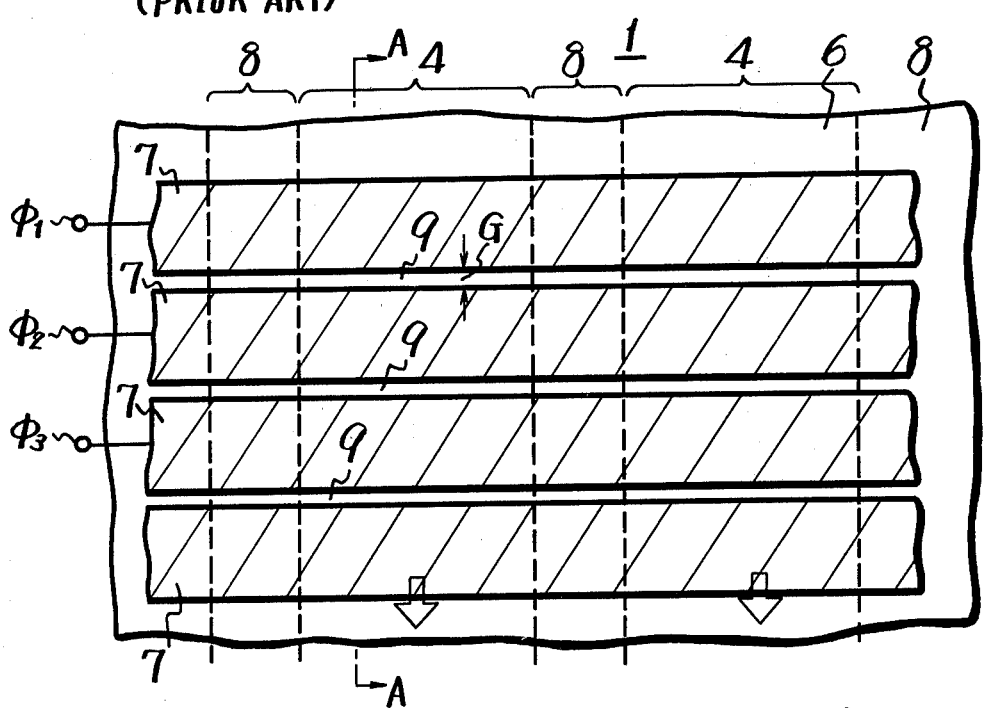
FIG. 2 is a fragmentary top plan diagram, showing in enlarged scale, an image sensing array used in a prior art solid state image sensor device shown in FIG. 1.
Figure 3:
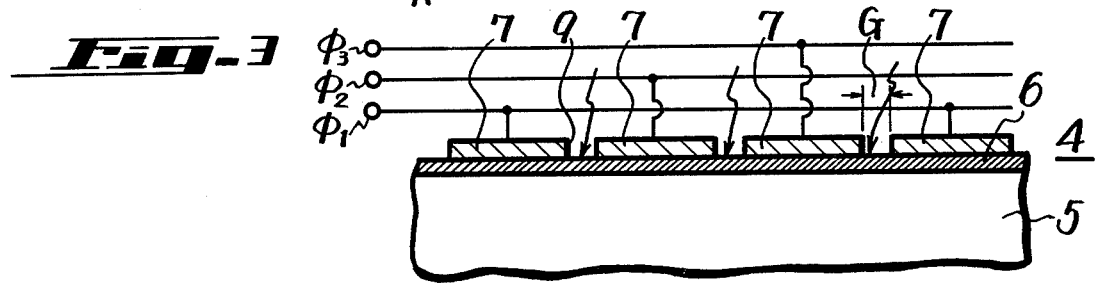
FIG. 3 is a cross-sectional view taken on the line A—A in FIG. 2.
Figure 6:
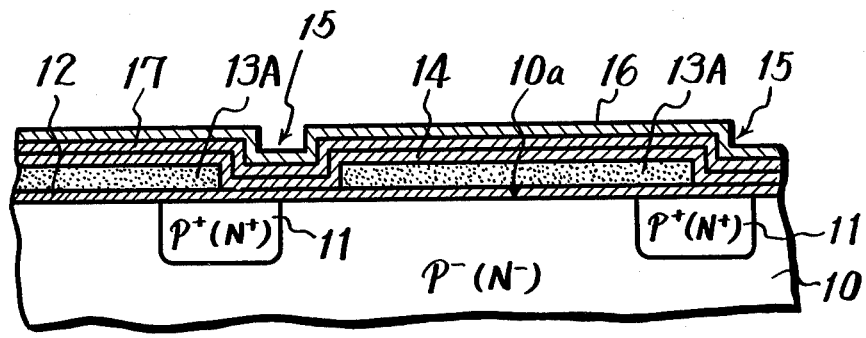
FIGS. 6, 7 and 8 are cross-sectional views taken on the lines A—A, B—B and C—C in FIG. 5, respectively.
Figure 7:
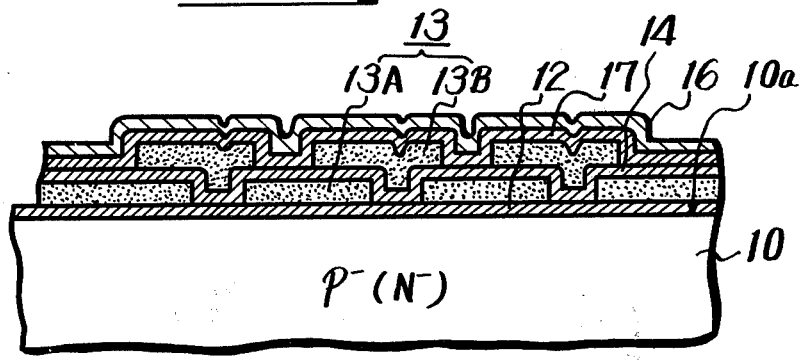
Figure 8:
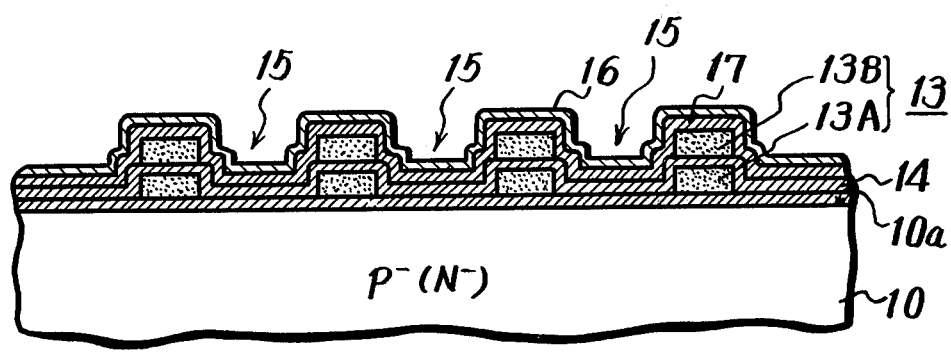

An example of the solid state image sensor device, especially its image sensing cell according to the invention will be described in detail with reference to FIGS. 5 to 8.

A semiconductor substrate, for example, silicon substrate 10, which is of one conductivity type, i.e., $P^-$ (or $N^-$) type and of low impurity concentration, is prepared. Strip channel stopper regions 11, which are of high impurity concentration and of the same conductivity type, i.e., $P^+$ (or $N^+$) type as the substrate 10, are formed in the substrate 10 to face its major surface 10a in, for example, the column direction with a predetermined distance between adjacent ones. An insulating layer 12 made of $SiO_2$ or the like is coated on the major surface 10a of the substrate 10. First strip electrode members 13A, which are made of transparent or opaque conductive layer such as polycrystalline silicon or metal, for example, aluminum, molybdenum or the like, are formed on the insulating layer 12 in the direction intersecting the extending direction of each channel stopper region 11, that is, in the row direction with a predetermined distance between the adjacent ones. The first electrode members 13A are shown in FIG. 5 with oblique lines sloping downwardly down to the right. Another insulating layer 14 made of, for example, $SiO_2$ is coated to cover the surfaces of the electrode members 13A and the portions therebetween, and second strip electrode members 13B made of the material substantially the same as that of the first electrode members 13A are formed between the adjacent first electrode members 13A along the latter through the insulating layer 14 in such a manner that both sides of the second electrode members 13B along the extending direction thereof rest on or overlap the adjacent first electrode members 13A. The second electrode members 13B are shown in FIG. 5 with oblique lines sloping downwardly down to the left.

Thus, the CTDs are formed between the adjacent channel stopper regions 11 in the column direction. In this invention, at the position displaced to one side in the portion between the adjacent channel stopper regions 11 or in the portion forming an image sensing cell or picture element, there is provided a window portion 15 where no electrode members 13A and 13B exist. The distance d between the electrode members 13A and 13B is selected to be such a value, for example, more than 4 $\mu m$ (micron) that the electric field produced by the electrode 13 does not affect on the surface 10a of the substrate 10 beneath the other electrode 13B. The window portion 15 may be formed such that it is extended to the middle of the channel stopper region 11 shown in FIG. 5. This window portion 15 serves as an image sensing cell.

If necessary, an insulating layer 17 made of $SiO_2$ or the like is coated to cover all the electrode members 13B, and a transparent electrode 16 such as Nesa is coated on the insulating layer 17 to cover the latter.

The adjacent first and second electrode members 13A and 13B are electrically connected at, for example, their one ends to form a transfer electrode 13. Every second transfer electrode 13 thus formed is made as a set. Upon transferring the carriers, 2-phase clock pulses $\phi_1$ and $\phi_2$ are applied to the electrode 13 of each set. The transparent electrode 16 is given a fixed potential such as the ground potential.

In order to better understand the solid state image sensor device of the invention described above, one method of making the same will be described with reference to FIGS. 9A to 9H.

As shown in FIG. 9A, the semiconductor substrate 10 with the channel stopper region 11 (not shown in FIG. 9A) is prepared first, and a silicon dioxide $SiO_2$ layer is formed on the surface of the substrate 10 by the thermal oxidization thereof to form the insulating layer 12.

Next, as shown in FIG. 9B, a silicon layer 20 of low resistivity is formed on the insulating layer 12 by doping a P-type or N-type impurity to a polycrystalline silicon layer at high concentration.

Then, the silicon layer or polycrystalline silicon layer 20 is subjected to photo-etching process to remove unnecessary portions thereof and thus form the first electrode members 13A with the silicon layer 20 as shown in FIG. 9C. At this time, a portion corresponding to the window portion 15 shown in FIG. 5 is formed in the first electrode member 13A.

As shown in FIG. 9D, the insulating layer 14 made of $SiO_2$ is formed on all the surface of the elements shown in FIG. 9C by a chemical vapor growth method or thermal oxidization.

As shown in FIG. 9E, a polycrystalline silicon layer 21 is formed on the insulating layer 14 by doping an impurity of P-type or N-type at high concentration thereto.

Then, the polycrystalline silicon layer 21 is subjected to photo-etching process to remove unnecessary portions thereof and hence to form the second strip electrode members 13B, as shown in FIG. 9F.

If necessary, an insulating layer 17 is formed to cover at least the second electrode members 13B by producing $SiO_2$ with thermal oxidization or the like as shown in FIG. 9G.

Further, if necessary, the transparent electrode such as Nesa layer 16 is coated on the insulating layer 17 as shown in FIG. 9H.

The operation of the solid state image sensor device of the invention described above will be described with reference to FIGS. 10A and 10B. During the light receiving period of the image sensing cell or period $\tau_1$ in which a charge or carrier pattern in accordance with a light image to be picked up is produced, one of two electrode groups made by connecting every second electrode 13 are supplied with the clock voltage, for example, −10V (volts) as shown in FIG. 10A, and the other electrode group are kept at 0V as shown in FIG. 10B. Thus, the charges or carriers induced in the substrate 10 beneath the respective windows 15 formed in the electrodes 13 are supplied with the voltage of −10V during the light receiving period $\tau_1$, then transferred to the parts of the substrate 10 beneath the electrodes 13 of the electrode group which establish a potential well (not shown) in the substrate 10 and stored therein. Accordingly, if the adjacent 2-phase clock voltages $\phi_1$ and $\phi_2$ are supplied to the electrodes during the next transfer period $\tau_2$, the stored carriers are transferred successively to the adjacent electrodes 13 in one direction and then to the storage array which was described in connection with FIG. 1. In this case, if the window portion 15 is formed to extend to or partially overlap the channel stopper region 11, this portion can be used as an image sensing cell also.

With the solid state image sensor device of the invention described above, no electrode 13 presents at the portion for receiving the light image, so that there is no defect that the light receiving sensitivity is lowered or infringed by the electrode 13, especially for light of short wave length. In addition, at the portions of the respective electrodes 13 other than the window portions 15 or the portions serving as the carrier transfer channels, there are no gaps therebetween, so that the carrier transfer efficiency is improved.

In general, the carrier transfer efficiency is not proportional to the width of the carrier transfer channel in the first degree function, but when the width of the transfer channel is decreased, the transfer efficiency is lowered abruptly.

According to the solid state image sensor device of the invention, since the window portion 15 is provided at the position displaced to one side of the portion between the adjacent channel stopper regions 11, the effective width of the transfer channel portion can be made wide. This causes the transfer efficiency to be improved also.

If the distance d of the window portion 15 between the electrodes 13 is selected too small or smaller than a predetermined value, for example, 4 $\mu$m, there may occur the fear that the carrier transfer is caused in the window portion 15. In this case, the carrier passing through this window portion is hard to affect by the voltage of the electrode 13 but is apt to be affected by the $SiO_2$ layer on the window portion 15 on which no electrode exists. As a result, the transfer efficiency becomes different at positions. For this reason, a uniform picture can not be obtained and also resolution is deteriorated. Therefore, it is desired that the distance d is selected greater than a predetermined value.

The above expression is given on the example where 2-phase clock type is employed. The case where 3-phase clock type is employed will be described with reference to FIGS. 11 and 12, in which the like numerals indicate the like elements and which also belongs to this invention.

In this case, the insulating layer 12 made of $SiO_2$ or the like is also formed on one major surface 10a of the semiconductor substrate 10 with the channel stopper regions 11, and a layer of high resistivity such as an intrinsic polycrystalline silicon layer 22 is formed on all the surface of the insulating layer 12, and a P-type or N-type impurity is selectively doped at high concentration in the layer 22 by, for example, diffusion to form the electrodes 13. In this case, a semi-insulating layer 23 made of parts of the polycrystalline silicon layer 22 is interposed between the adjacent electrodes 13, and also parts of the layer 22 are removed by the photo-etching to form the window portions 15. Every third electrode 13 is electrically connected to form three sets of electrode group and the three sets of electrodes are supplied with 3-phase clock $\phi_1$, $\phi_2$ and $\phi_3$ upon the carrier transfer.

With the solid state image sensor device of the invention described just above, the receiving of light is carried out through the window portion 15 formed in the electrode 13 also, so that the light receiving sensitivity can be improved especially in light of short wave length as compared with the case where the light is received through the electrode made of polycrystalline silicon. Further, since the semi-insulating layer 23 is interposed between the adjacent electrodes 13 other than the window portion 15, no substantial gap exists between the electrodes 13 and hence the carrier transfer efficiency is high.

It will be apparent that many modifications and variations could be effected by one skilled in the art without departing from the spirit or scope of the novel concepts of the present invention, so that the scope of the invention should be determined by the appended claims.

We claim as our invention:

1. A solid state image sensor device comprising:
   (a) a semiconductor substrate of one conductivity type;
   (b) an insulating layer formed on a first surface of said substrate;
   (c) a plurality of channel stopper regions of said one conductivity type having a higher impurity concentration than said substrate formed in said substrate adjacent to said first surface, said channel stopper regions extending in parallel in a first direction with a distance between adjacent channel stopper regions defining transfer channels therebetween;
   (d) a plurality of sets of electrodes formed on said insulating layer over said transfer channels, each set of which includes a lower electrode member and a higher electrode member, a second insulating layer covering said lower electrode member of each set and separating said higher electrode member from said lower electrode member, said lower electrode member being formed closer to said substrate than said higher electrode member, each of said electrode members extending in a second direction transverse to said first direction, both sides of each of said higher electrode members along said extending direction overlapping an adjacent side of said lower electrode member; and
   (e) a plurality of window portions over said transfer channels formed in said sets of electrodes, each portion formed through at least one of said electrode members, which comprise portions of said insulating layers, said window portions being located at one edge of said transfer channel adjacent one of said channel stopper regions.

2. A solid state image sensor device as claimed in claim 1, wherein the width of each of said window portions in said first direction is selected to be more than a predetermined value.

3. A solid state image sensor device as claimed in claim 2, wherein said predetermined value is 4 microns.

4. A solid state image sensor device as claimed in claim 1, wherein said window portions partially overlap said channel stopper regions.

5. A solid state image sensor device as claimed in claim 1, wherein each of said electrodes is made of a polycrystalline silicon with an impurity doped thereinto.

6. A solid state image sensor device comprising:
(a) a semiconductor substrate of one conductivity type;
(b) an insulating layer formed on a first surface of said substrate;
(c) a plurality of channel stopper regions of said one conductivity type having a higher impurity concentration than said substrate formed in said substrate adjacent to said first surface, said channel stopper regions extending in parallel in a first direction with a predetermined distance between adjacent channel stopper regions defining transfer channels therebetween;
(d) a plurality of electrodes formed on said insulating layer over said transfer channels, said electrodes extending in a second direction transverse to said first direction with a gap between adjacent electrodes;
(e) a plurality of semi-insulating layers formed on said insulating layer, each of said semi-insulating layers being disposed between adjacent electrodes; and
(f) a plurality of window portions over said transfer channels formed between adjacent electrodes and through said semi-insulating layers which comprise portions of said insulating layer which are not covered by said electrodes and semi-insulating layers at one side of said transfer channel adjacent to one of said channel stopper regions.

7. A solid state image sensor device as claimed in claim 6, in which said window portions partially overlap said channel stopper regions.

* * * * *